(12) United States Patent
Ding et al.

(10) Patent No.: US 6,566,259 B1
(45) Date of Patent: *May 20, 2003

(54) INTEGRATED DEPOSITION PROCESS FOR COPPER METALLIZATION

(75) Inventors: Peijun Ding, San Jose, CA (US); Imran Hashim, San Jose, CA (US); Barry Chin, Saratoga, CA (US); Bingxi Sun, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 12 days.

This patent is subject to a terminal disclaimer.

(21) Appl. No.: 09/710,383

(22) Filed: Nov. 9, 2000

Related U.S. Application Data

(63) Continuation of application No. 09/204,323, filed on Dec. 2, 1998, now Pat. No. 6,174,811.
(60) Provisional application No. 60/067,108, filed on Dec. 2, 1997.

(51) Int. Cl.⁷ ................ H01L 21/4763; H01L 21/44
(52) U.S. Cl. ................ 438/687; 438/627; 438/643; 438/646; 438/653; 438/680; 438/688
(58) Field of Search ................ 438/687, 632, 438/643, 627, 646, 653, 678, 676, 680, 685, 688

(56) References Cited

U.S. PATENT DOCUMENTS

| | | | |
|---|---|---|---|
| 4,364,099 A | 12/1982 | Koyama et al. | 361/305 |
| 4,649,625 A | 3/1987 | Lu | 29/571 |
| 4,753,851 A | 6/1988 | Roberts et al. | 428/627 |
| 4,760,369 A | 7/1988 | Tiku | 338/308 |
| 5,049,251 A | 9/1991 | Inoue | 204/192.12 |
| 5,108,569 A | 4/1992 | Gilboa et al. | 204/192.13 |
| 5,112,448 A * | 5/1992 | Chakravorty | |
| 5,142,438 A | 8/1992 | Reinberg et al. | 361/313 |
| 5,225,363 A | 7/1993 | Riemenschneider et al. | 437/47 |
| 5,352,623 A | 10/1994 | Kamiyama | 437/52 |
| 5,354,712 A * | 10/1994 | Ho et al. | |
| 5,439,574 A | 8/1995 | Kobayashi et al. | 204/192.12 |
| 5,487,923 A | 1/1996 | Min et al. | 427/569 |
| 5,508,221 A | 4/1996 | Kamiyama | 437/60 |
| 5,563,090 A | 10/1996 | Lee et al. | 437/60 |
| 5,614,437 A | 3/1997 | Choudhury | 437/140 |
| 5,633,200 A | 5/1997 | Hu | 438/653 |
| 5,654,233 A | 8/1997 | Yu | 438/643 |
| 5,717,628 A | 2/1998 | Hammerl et al. | 365/149 |
| 5,747,360 A | 5/1998 | Nulman | 437/189 |
| 5,792,522 A | 8/1998 | Jin et al. | 427/575 |
| 5,801,098 A | 9/1998 | Fiordalice et al. | 438/653 |
| 5,897,375 A | 4/1999 | Watts et al. | 438/693 |
| 5,933,758 A | 8/1999 | Jain | 438/687 |
| 5,962,923 A * | 10/1999 | Xu et al. | |
| 5,985,103 A | 11/1999 | Givens et al. | 204/192.12 |
| 6,001,727 A * | 12/1999 | Ohmi et al. | 438/618 |
| 6,001,730 A | 12/1999 | Farkas et al. | 438/627 |
| 6,069,068 A * | 5/2000 | Rathore et al. | |
| 6,080,285 A | 6/2000 | Liu et al. | 204/192.12 |
| 6,130,161 A * | 10/2000 | Ashley et al. | |
| 6,140,228 A | 10/2000 | Shan et al. | 438/653 |
| 6,174,711 B1 * | 1/2001 | Ding et al. | 438/687 |
| 6,174,811 B1 | 1/2001 | Ding et al. | 438/687 |
| 6,313,033 B1 | 11/2001 | Chiang et al. | 438/654 |

\* cited by examiner

*Primary Examiner*—Ha Tran Nguyen
(74) *Attorney, Agent, or Firm*—Moser, Patterson & Sheridan

(57) ABSTRACT

Metallization process sequences are provided for forming reliable interconnects including lines, vias and contacts. An initial barrier layer, such as Ta or TaN, is first formed on a patterned substrate followed by seed layer formed using high density plasma PVD techniques. The structure is then filled using either 1) electroplating, 2) PVD reflow, 3) CVD followed by PVD reflow, or 4) CVD.

27 Claims, 1 Drawing Sheet

INTEGRATED DEPOSITION PROCESS FOR COPPER METALLIZATION

This is a continuation of application Ser. No. 09/204,323 filed on Dec. 2, 1998 now U.S. Pat. No. 6,174,811.

This application claims priority from U.S. Provisional Patent Application Serial No. 60/067,108, filed Dec. 2, 1997.

BACKGROUND OF THE INVENTION

1. Field of the Invention

The present invention generally relates to integrated circuit and flat panel display fabrication. More specifically, the invention relates to process sequences for fabricating copper interconnect structures and other metallization structures.

2. Background of the Related Art

Modern semiconductor integrated circuits usually involve multiple metal layers separated by dielectric (insulating) layers, such as silicon dioxide or silica, often referred to simply as an oxide layer, although other materials are being considered for use as the dielectric. The layers are electrically connected by interconnects (i.e., lines, vias and contacts) which penetrate the intervening oxide layer and contact some underlying conductive feature.

Interconnects have presented an increasingly difficult problem as integrated circuits are formed with an increasing density of circuit elements because the feature sizes have continued to shrink. For logic applications, the thickness of the oxide layer seems to be constrained to the neighborhood of 1 $\mu$m, while the diameter of contacts and vias is being reduced from the neighborhood of 0.35 $\mu$m to 0.18 $\mu$m and below. As a result, the aspect ratios (the ratio of the depth to the minimum lateral dimension) of the contacts and vias are being pushed to 5:1 and above.

As sizes continue to decrease, the characteristics of the material forming the interconnects become increasingly important. The smaller the feature, the less resistive the material forming the feature should be for speed performance. Copper is a material which is becoming more important as a result. Copper has a resistivity of 1.7 $\mu\Omega$.cm and a small RC time constant thereby increasing the-speed of a device formed thereof. In addition, copper exhibits improved reliability over aluminum in that copper has excellent electromigration resistance and can drive more current in the lines.

One problem with the use of copper is that copper diffuses into silicon dioxide, silicon and other dielectric materials. Therefore, conformal barrier layers become increasingly important to prevent copper from diffusing into the dielectric and compromising the integrity of the device. Barrier layers for copper applications are available for interlayer dielectric applications. The use of a thin silicon nitride (SiN) layer on the interlayer dielectric will effectively inhibit interlayer diffusion. Within the same dielectric layer it is difficult to provide an effective barrier to prevent leakage between lines. Several technologies are presently under investigation which add a barrier liner to the via sidewall separating the copper metal from the interlayer dielectric. Common physical vapor deposition (PVD) technologies are limited in high aspect ratio and re-entrant structures due to the directional nature of their deposition. The barrier thickness will depend directly upon the structure architecture with the barrier becoming thinner on the sidewall near the structure bottom. The barrier thickness, and therefore the barrier integrity, will be compromised under overhangs on re-entrant structures.

In contrast, CVD deposited films are by their nature conformal in re-entrant structures. Further, CVD deposited films maintain a high degree of conformity to the structure's lower interface. Silicon nitride ($Si_xN_y$) and titanium nitride (TiN) prepared by decomposition of an organic material (TDMAT) are common semiconductor manufacturing materials which display the described conformal performance. Both materials are perceived as being good barriers to Cu interdiffusion, but are considered unattractive due to their high resistivity. The high resistive nature of the material would detrimentally affect the via resistance performance which must be maintained as low as possible to maximize device performance.

Therefore, there is a need for a process sequence and related hardware which provides a good barrier layer on the aperture sidewall, but which does not negatively affect the resistance of the plug.

SUMMARY OF THE INVENTION

The invention generally provides process sequences for depositing copper interconnects and other metallization features. In one embodiment, a patterned substrate having a contact, via, line or other conductive feature thereon, is introduced into a first chamber where a barrier layer comprising tantalum, tantalum nitride, $Si_xN_y$ or other suitable barrier layer is formed thereon. The substrate is preferably cleaned prior to deposition of the barrier layer to remove native oxides or other contaminants from the substrate. The barrier layer is preferably deposited to a thickness of about 200 to about 500 Å using a high density plasma physical vapor deposition chamber. Following deposition of the barrier layer, a copper or other metal film is deposited on the barrier layer. Preferably, copper is first deposited using a high density plasma physical vapor deposition technique followed by 1) electroplating, 2) physical vapor deposition copper reflow, 3) chemical vapor deposition followed by physical vapor deposition copper reflow, or 4) chemical vapor deposition.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

Figure 1:
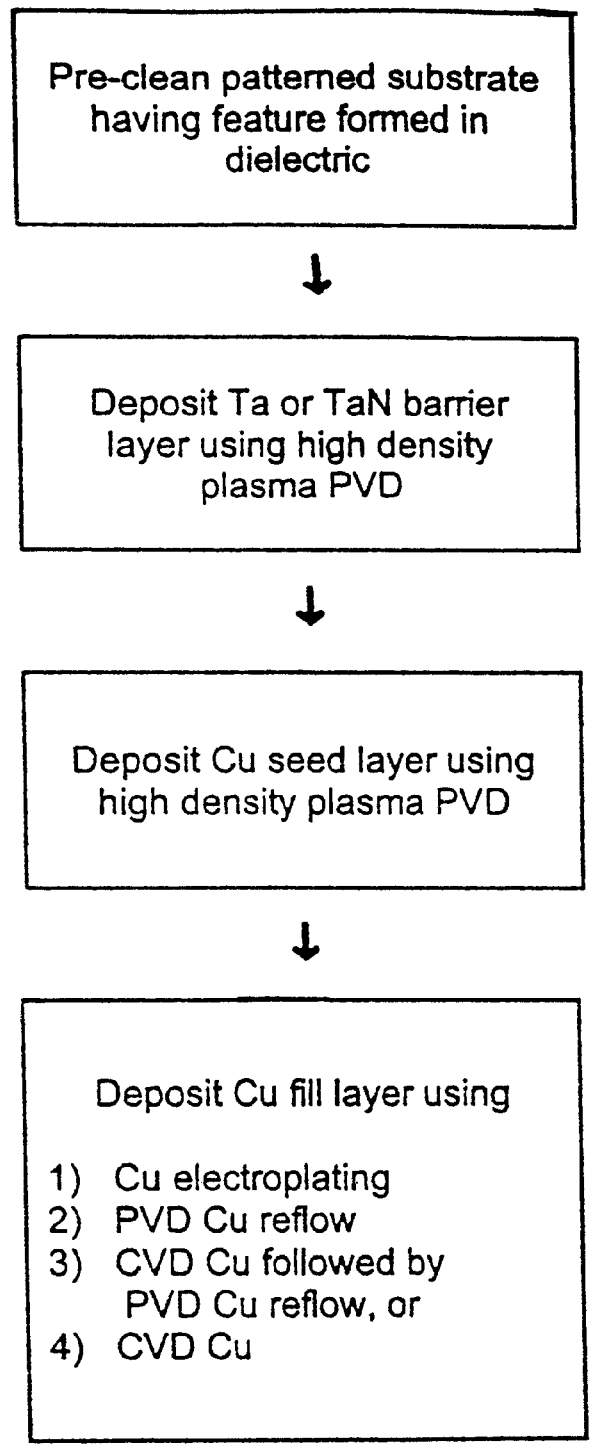
FIG. 1 is a flow diagram of the process sequences of the invention.

The invention is described below with reference to the flow diagram depicted in FIG. 1. Each of the process sequences begin with substrate preparation followed by a barrier layer deposition step. Several metal deposition sequences are then performed to complete the formation of the conductive interconnects.

The preferred embodiments described below can be carried out using process equipment available from Applied Materials, Inc., located in Santa Clara, Calif. The equipment includes an integrated Endura platform having a Preclean II chamber, an IMP PVD Ta/TaN chamber, a PVD Cu chamber, an IMP PVD Cu chamber, and a CVD Cu chamber. Electroplating can be performed using a commercially available system from Semitool, Inc., of Kalispell, Mont., or other electroplating equipment supplier.

FIG. 1 is a flow diagram showing the initial steps of each process of the invention. The processes of the invention are preferably performed on a substrate having one or more features such as contacts, vias, lines or other interconnect features formed thereon. The interconnect features may be any size and have any aspect ratio, however, the trend has been to decrease feature dimensions and increase aspect ratios. The invention has particular application in the small dimension (e.g., less than 0.25 μm), high aspect ratio (e.g., 3 or higher) features. The substrate is first preferably subjected to a cleaning process such as argon bombardment in a precleaning chamber where about 100 to about 300 Å of material on the substrate surface is removed to eliminate native oxides or other contaminants from the surface.

Next, the substrate is moved into a high density plasma PVD Chamber where a barrier layer of tantalum, tantalum nitride, or combinations thereof is deposited over the cleaned and patterned surface of the substrate. The barrier layer is preferably deposited to a thickness of about 200 Å to about 500 Å.

IMP tantalum is deposited using an IMP PVD Chamber with a tantalum target disposed therein. The substrate support member is heated to a temperature of between about 100–400° C. Argon is flown into the chamber at a rate of about 35 sccm to about 85 sccm. A target bias of about 0.5 to about 5 kW and a coil RF power of about 0.5 to about 3 kW are delivered to the target and source coil, respectively. A 13.56 MHz bias of about 0–500 W is applied to the substrate. The pressure in the chamber is maintained in the range of about 10–45 mTorr.

IMP tantalum nitride is deposited using an IMP PVD Chamber with a tantalum target disposed therein. The substrate support member is heated to a temperature of between about 100–400° C. Argon is flown into the chamber at a rate of about 35 sccm to about 75 sccm and nitrogen is flown into the chamber at a rate of about 10 sccm to about 20 sccm. A target bias of about 0.5 to about 5 kW and a coil RF power of about 0.5 to about 3 kW are delivered to the target and source coil, respectively. A 13.56 MHz bias of about 0–500 W is applied to the substrate. The pressure in the chamber is maintained in the range of about 10–45 mTorr.

The interconnect features are then at least partially filled using a high density plasma physical vapor deposition technique. Preferably, the barrier layer and seed layer are deposited in an integrated system without moving the substrate into an ambient environment between deposition steps. This provides good adhesion between the barrier layer and the seed layer. In addition, good film texture results. Copper is deposited to a thickness of about 1000 Å to about 2000 Å to form a copper seed layer. IMP copper is deposited using an IMP PVD Chamber. The substrate support member is heated to a temperature of between about 50–250° C. Argon is flown into the chamber at a rate of about 35 to about 85 sccm. A target bias of about 0.5 to about 5 kW and a coil RF power of about 0.5 to about 3 kW are delivered to the target and source coil, respectively. A 13.56 MHz bias of about 0–500 W is applied to the substrate. The pressure in the chamber is maintained in the range of about 10–45 mTorr.

One metallization process to complete the fill of the interconnect is electroplating. Following the initial IMP PVD copper deposition, the substrate is moved to an electroplating system where a copper layer is deposited on the IMP PVD copper seed layer to complete interconnect fill and to form a metal layer over the field of the substrate.

Another metallization process to complete the fill of the interconnect is PVD Cu reflow. Following the initial IMP PVD copper deposition, the substrate is moved to a PVD copper reflow chamber where a copper layer is deposited at a substrate temperature of between about 200 to about 450° C. to complete interconnect fill and to form a metal layer over the field of the substrate. The pressure in the chamber is maintained between about 0.3 and about 50 mTorr. A DC bias is applied to the target in the range of about 2 to about 12 kW.

Another metallization process to complete the fill of the interconnect is CVD Cu followed by PVD Cu reflow. Following the initial IMP PVD copper deposition, the substrate is moved to a CVD copper chamber where a CVD Cu layer, preferably about 100–1000 Å, is grown on the IMP PVD copper seed layer. A PVD Cu layer is then deposited on the CVD Cu layer at a substrate temperature of between about 100 to about 450° C. The deposition sequence using a CVD wetting layer followed by a PVD layer is disclosed in U.S. patent application Ser. No. 08/561,605, commonly assigned to Applied Materials, Inc.

CVD Cu may be deposited using any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper$^{+1}$hfac,TMVS (hfac being an abbreviation for the hexafluoro acetylacetonate anion and TMVS being an abbreviation for trimethylvinylsilane) with argon as the carrier gas.

Another metallization process to complete the fill of the interconnect is CVD Cu. Following the initial IMP PVD copper deposition, the substrate is moved to a CVD copper chamber where a CVD Cu layer is grown on the IMP PVD copper seed layer to complete the interconnect fill and to form a metal layer on the field of the substrate.

The metal layer can be planarized using chemical mechanical polishing or other planarization techniques.

The present invention has been described above with reference to a copper metallization technique. It is to be understood that copper is the material currently being investigated for use in very large scale integration (VLSI) and ultra large scale integration (ULSI). Other materials such as aluminum can be deposited in accordance with the invention.

While foregoing is directed to the preferred embodiment of the present invention, other and further embodiments of the invention may be devised without departing from the basis scope thereof, and the scope thereof is determined by the claims that follow.

What is claimed is:

1. A process for forming an interconnect on a patterned substrate, comprising:
   depositing a barrier layer on the substrate in a first high density physical vapor deposition chamber;
   depositing a seed layer on the barrier layer in a second high density physical vapor deposition chamber; and
   depositing a first metal layer on the seed layer, wherein the seed layer and the first metal layer comprise the same material.

2. The process of claim 1, wherein the first metal layer is deposited by electroplating.

3. The process of claim 2, wherein the barrier layer comprises tantalum, tantalum nitride, or combinations thereof, and the seed layer and the first metal layer comprise copper.

4. The process of claim 1, wherein the first metal layer is deposited in a physical vapor deposition reflow chamber at a substrate temperature between about 200° C. and about 450° C.

5. The process of claim 4, wherein the barrier layer comprises tantalum, tantalum nitride, or combinations thereof, and the seed layer and the first metal layer comprise copper.

6. The process of claim 1, wherein the first metal layer is deposited by chemical vapor deposition.

7. The process of claim 6, further comprising depositing a second metal layer over the first metal layer at a substrate temperature between about 100° C. and about 450° C. by physical vapor deposition.

8. The process of claim 7, wherein the barrier layer comprises tantalum, tantalum nitride, or combinations thereof, and the seed layer, the first metal layer, and the second metal layer comprise copper.

9. The process of claim 6, wherein the barrier layer comprises tantalum, tantalum nitride, or combinations thereof, and the seed layer and the first metal layer comprise copper.

10. The process of claim 1, wherein depositing the barrier layer comprises delivering a bias between about 0.5 kW and about 5 kW to a target, delivering RF power between about 0.5 kW and about 3 kW to a source coil, and delivering a bias between about 0 W and about 500 W to the substrate.

11. The process of claim 1, wherein depositing the seed layer comprises delivering a bias between about 0.5 kW and about 5 kW to a target, delivering RF power between about 0.5 kW and about 3 kW to a source coil, and delivering a bias between about 0 W and about 500 W to the substrate.

12. The process of claim 1, wherein the barrier layer and the seed layer are deposited in an integrated system.

13. A process for forming an interconnect on a patterned substrate, comprising:

depositing a barrier layer on the substrate by delivering a bias between about 0.5 kW and about 5 kW to a target and delivering a bias between about 0 W and about 500 W to the substrate and establishing a pressure of about 45 mTorr or less in a first high density physical vapor deposition chamber;

depositing a seed layer on the barrier layer by delivering a bias between about 0.5 kW and about 5 kW to a target and delivering a bias between about 0 W and about 500 W to the substrate and establishing a pressure of about 45 mTorr or less in a second high density physical vapor deposition chamber; and depositing a first metal layer on the seed layer, wherein the seed layer and the first metal layer comprise the same material.

14. The process of claim 13, wherein the first metal layer is deposited by electroplating.

15. The process of claim 13, wherein the first metal layer is deposited in a physical vapor deposition reflow chamber at a substrate temperature between about 200° C. and about 450° C.

16. The process of claim 13, wherein the first metal layer is deposited by chemical vapor deposition.

17. The process of claim 16, further comprising depositing a second metal layer on the first metal layer at a substrate temperature between about 100° C. and about 450° C. by physical vapor deposition.

18. The process of claim 17, wherein the barrier layer comprises tantalum, tantalum nitride, or combinations thereof, and the seed layer, the first metal layer, and the second metal layer comprise copper.

19. The process of claim 13, wherein the barrier layer comprises tantalum, tantalum nitride, or combinations thereof, and the seed layer and the first metal layer comprise copper.

20. The process of claim 13, wherein depositing the barrier layer further comprises delivering RF power between about 0.5 kW and about 3 kW to a source coil.

21. The process of claim 13, wherein depositing the seed layer further comprises delivering RF power between about 0.5 kW and about 3 kW to a source coil.

22. The process of claim 13, wherein the barrier layer and the seed layer are deposited in an integrated system.

23. A process for forming an interconnect, comprising:

depositing a barrier layer on the substrate, wherein the barrier layer is selected from the group of tantalum, tantalum nitride, and combinations thereof, in a first high density physical vapor deposition chamber;

depositing a copper seed layer on the barrier layer in a second high density physical vapor deposition chamber; and depositing a copper layer on the copper seed layer by electroplating.

24. The process of claim 23, wherein depositing the barrier layer comprises delivering a bias between about 0.5 kW and about 5 kW to a target and delivering a bias between about 0 W and about 500 W to the substrate disposed in the first high density physical vapor deposition chamber.

25. The process of claim 24, wherein depositing the barrier layer further comprises delivering RF power between about 0.5 kW and about 3 kW to a source coil disposed in the first high density physical vapor deposition chamber.

26. The process of claim 23, wherein depositing the copper seed layer comprises delivering a bias between about 0.5 kW and about 5 kW to a target and delivering a bias between about 0 W and about 500 W to the substrate disposed in the first high density physical vapor deposition chamber.

27. The process of claim 26, wherein depositing the copper seed layer further comprises delivering RF power between about 0.5 kW and about 3 kW to a source coil disposed in the first high density physical vapor deposition chamber.

* * * * *